(12) United States Patent
Komukai

(10) Patent No.: US 7,977,162 B2
(45) Date of Patent: Jul. 12, 2011

(54) SEMICONDUCTOR DEVICE, METHOD FOR THE SAME, AND HEAT RADIATOR

(75) Inventor: Naoki Komukai, Sakata (JP)

(73) Assignee: Seiko Epson Corporation (JP)

( * ) Notice: Subject to any disclaimer, the term of this patent is extended or adjusted under 35 U.S.C. 154(b) by 139 days.

(21) Appl. No.: 12/170,072

(22) Filed: Jul. 9, 2008

(65) Prior Publication Data
US 2009/0032936 A1    Feb. 5, 2009

(30) Foreign Application Priority Data

Jul. 31, 2007   (JP) .................................. 2007-198270

(51) Int. Cl.
    *H01L 21/00*    (2006.01)
(52) U.S. Cl. ........ 438/125; 438/122; 257/707; 257/704; 257/712; 257/E23.101
(58) Field of Classification Search .................. 257/707; 438/125
See application file for complete search history.

(56) References Cited

U.S. PATENT DOCUMENTS

| 5,729,052 A * | 3/1998 | Tonti et al. ..................... 257/712 |
| 2001/0032719 A1* | 10/2001 | Kim et al. ..................... 165/185 |
| 2006/0038283 A1* | 2/2006 | Su et al. ..................... 257/706 |

FOREIGN PATENT DOCUMENTS

| JP | 2004-332017 | 11/2004 |
| JP | 2006-222406 | 8/2006 |
| JP | 2007-035687 | 2/2007 |

* cited by examiner

*Primary Examiner* — Ajay K Arora
(74) *Attorney, Agent, or Firm* — Harness, Dickey & Pierce, P.L.C.

(57) ABSTRACT

A semiconductor device includes a semiconductor chip, and a multicomponent alloy layer formed on a face of the semiconductor chip, the multicomponent alloy layer being in a solid-liquid coexisting state in a specific temperature range, and including a surface having concavity and convexity caused by solidification segregation.

1 Claim, 4 Drawing Sheets

SEMICONDUCTOR DEVICE, METHOD FOR THE SAME, AND HEAT RADIATOR

The entire disclosure of Japanese Patent Application No. 2007-198270, filed Jul. 31, 2007 is expressly incorporated by reference herein.

BACKGROUND

1. Technical Field

The present invention relates to a semiconductor device having a structure that dissipates heat from a semiconductor chip and can be formed with a simple process, and a method for manufacturing the semiconductor device. Further, the invention relates to a semiconductor device, and a heat radiator that have high heat dissipation efficiency, and a method for manufacturing the semiconductor device.

2. Related Art

A semiconductor chip generates heat upon an operation. In related art, in order to efficiently dissipate heat generated by a semiconductor chip, a heatsink is mounted on the semiconductor chip with an adhesive agent or a screw (e.g. JP-A-2006-222406 (FIG. 28)).

As described above, in related art, in order to efficiently dissipate heat generated by a semiconductor chip, a heat radiator is mounted on the semiconductor chip with an adhesive agent or a screw. Therefore, the number of manufacturing steps has been increased.

Further, if high heat dissipation efficiency from a heat radiator of a semiconductor chip to the air is achived, the heat radiator can be downsized.

SUMMARY

An advantage of the present invention is to provide a semiconductor device having a structure that dissipates heat from a semiconductor chip and can be manufactured through a simple process, and a method for manufacturing the same. Further, another advantage of the invention is to provide a semiconductor device, and a heat radiator that have high heat dissipation efficiency, and a method for manufacturing the semiconductor device.

A semiconductor device according to a first aspect of the invention includes: a semiconductor chip, and a multicomponent alloy layer formed on a face of the semiconductor chip, the multicomponent alloy layer being in a solid-liquid coexisting state in a specific temperature range, and including a surface having concavity and convexity caused by solidification segregation.

According to the semiconductor device, the multicomponent alloy layer having the concavity and convexity is formed on any face of the semiconductor chip, thereby providing a same advantageous effect to be obtained by increasing a surface area of a rear face of the semiconductor chip. As a result, heat dissipation efficiency of the semiconductor chip is improved. Further, compared to a case of mounting a heat radiator on the rear face of the semiconductor chip, a step to form a heat dissipation structure is simplified.

A semiconductor device according to a second aspect of the invention includes: a semiconductor chip, a heat radiator mounted on a face of the semiconductor chip, and a multicomponent alloy layer formed on a face of the heat radiator, the multicomponent alloy layer being in a solid-liquid coexisting state in a specific temperature range, and including a surface having concavity and convexity caused by solidification segregation.

According to the semiconductor device, the multicomponent alloy layer having the concavity and convexity is formed on any face of the heat radiator. Therefore, a same advantageous effect to be obtained by increasing a surface area of the heat radiator is obtained, resulting in increasing heat dissipation efficiency from the heat radiator to the air. Therefore, the heat radiator can be reduced in size.

In the semiconductor devices as above, for example, the multicomponent alloy layer may be one of a Sn—Bi alloy layer and a Pb—Sn alloy layer.

A heat radiator to be mounted on a face of a semiconductor chip according to a third aspect of the invention includes a multicomponent alloy layer provided on a face other than a face to be jointed to the semiconductor chip, the multicomponent alloy layer being in a solid-liquid coexisting state in a specific temperature range, and including a surface having concavity and convexity caused by solidification segregation.

A method for manufacturing a semiconductor device according to a fourth aspect of the invention includes: a) forming a multicomponent alloy layer on a rear face of a semiconductor wafer having a plurality of semiconductor elements formed on a front face, the multicomponent alloy layer being in a solid-liquid coexisting state in a specific temperature range; b) dividing the semiconductor wafer and the multicomponent alloy layer into a plurality of semiconductor chips; and c) heating the multicomponent alloy layer to be in the specific temperature range so as to be in the solid-liquid coexisting state and cooling the multicomponent alloy layer having been heated after step a).

A method for manufacturing a semiconductor device according to a fifth aspect of the invention includes: d) forming a multicomponent alloy layer on a face of a semiconductor wafer, the multicomponent alloy layer being in a solid-liquid coexisting state in a specific temperature range; e) forming a plurality of semiconductor elements on a surface of the semiconductor wafer; f) dividing the semiconductor wafer and the multicomponent alloy layer into a plurality of semiconductor chips; and g) heating the multicomponent alloy layer to be in the specific temperature range so as to be in the solid-liquid coexisting state and cooling the multicomponent alloy layer having been heated after step d).

A method for manufacturing a semiconductor device according to a sixth aspect of the invention includes: forming a multicomponent alloy layer on a face of a heat radiator, the multicomponent alloy layer being in a solid-liquid coexisting state in a specific temperature range; heating the multicomponent alloy layer to be in the specific temperature range so as to be in the solid-liquid coexisting state and cooling the multicomponent alloy layer having been heated; and fixing a face of the heat radiator other than a face having the multicomponent alloy layer being formed to a semiconductor chip.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
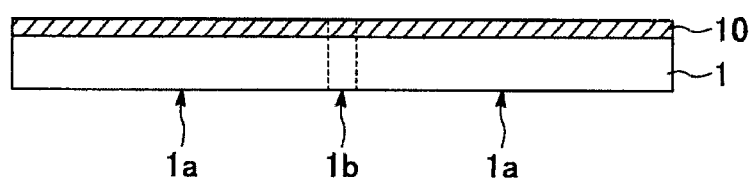
FIGS. 1A to 1C are sectional views for explaining a method for manufacturing a semiconductor device according to a first embodiment.
Figure 1B:
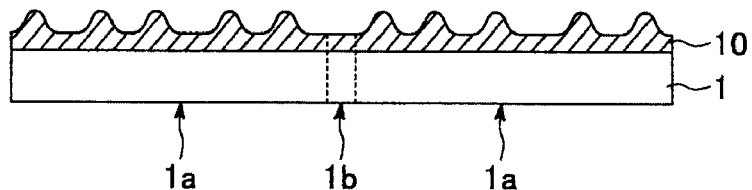
Figure 1C:
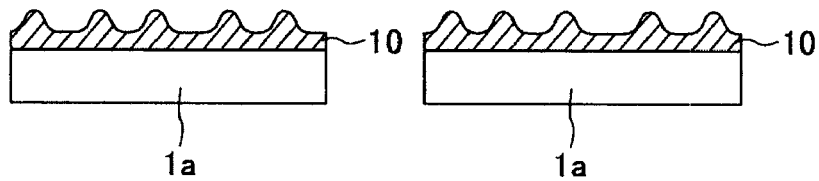

Embodiments of the invention will now be described with reference to the accompanying drawings. FIGS. 1A to 1C are sectional views for explaining a method for manufacturing a semiconductor device according to a first embodiment of the invention. First, as shown in FIG. 1A, a semiconductor wafer 1 (e.g. silicon wafer) is prepared. On a front face of the semiconductor wafer 1, an element isolation structure, a plurality of semiconductor elements (e.g. transistors), a wiring layer and an interlayer insulating film, an external connection terminal, and a passivation film are formed. The semiconductor wafer 1 is divided along a dicing line 1b into a plurality of semiconductor chips 1a in a later step.

Then, a multicomponent alloy layer 10 is formed on a rear face of the semiconductor wafer 1. The multicomponent alloy layer 10 is formed by electroless plating, electrolytic plating, or hot dipping, for example. A thickness of the multicomponent alloy layer 10 is from 5 μm to 20 μm inclusive, for example. The multicomponent alloy layer 10 is a Sn—Bi alloy layer, or a Pb—Sn alloy layer, for example, and can be in a solid state (an alloy) in a specific temperature range and also in a solid-liquid coexisting state in another specific temperature range.

Figure 2A:
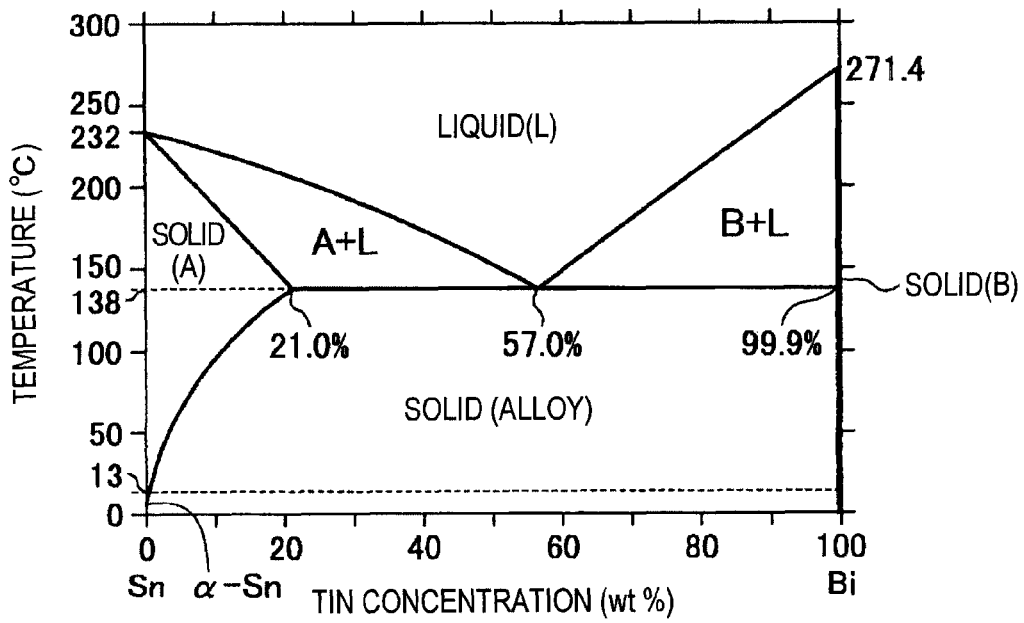
FIG. 2A is a Sn—Bi binary phase diagram.

FIG. 2A is a Sn—Bi binary phase diagram. A Sn—Bi alloy has both a temperature range to be an alloy and a temperature range to be in a solid-liquid coexisting state when Sn is included in a range from 21% by weight to 99.9% by weight inclusive. Specifically, when Sn is included in a range from 21% by weight to 57% by weight inclusive, the alloy is a solid at a temperature of less than 138 degrees Celsius, but if the temperature is more than 138 degrees Celsius, the alloy becomes in a state in which Sn and a liquid phase of a Sn—Bi alloy coexist. Further, when Sn is included more than 57% by weight and 99.9% by weight or less, the alloy is a solid at a temperature of less than 138 degrees Celsius, but if the temperature is more than 138 degrees Celsius, the alloy becomes in a state in which Bi and a liquid phase of a Sn—Bi alloy coexist. In any cases, Sn becomes a single phase state of a liquid phase at a certain temperature or above.

Figure 2B:
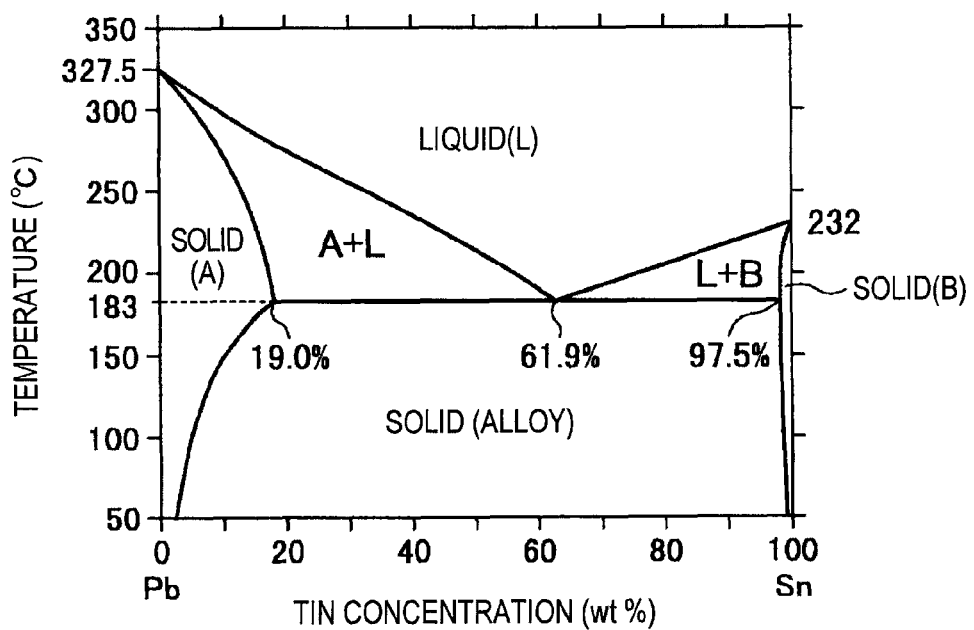
FIG. 2B is a Pb—Sn binary phase diagram.

FIG. 2B is a Pb—Sn binary phase diagram. A Pb—Sn alloy has both a temperature range to be an alloy and a temperature range to be in a solid-liquid coexisting state when Pb is from 19% by weight to 97.5% by weight inclusive. Specifically, when Pb is included from 19% by weight to 61.9% by weight inclusive, the alloy is a solid at a temperature of less than 183 degrees Celsius, but if the temperature is more than 183 degrees Celsius, the alloy becomes in a state in which Pb and a liquid phase of a Pb—Sn alloy coexist. Further, when Pb is included more than 61.9% by weight and 97.5% by weight or less, the alloy is a solid at a temperature of less than 183 degrees Celsius, but if the temperature is more than 183 degrees Celsius, the alloy becomes in a state in which Sn and a liquid phase of a Pb—Sn alloy coexist. In any cases, Pb becomes a single phase state of a liquid phase at a certain temperature or above.

Going back to FIG. 1., and then referring to FIG. 1B, the multicomponent alloy layer 10 is heated at a temperature in a temperature range to be in a solid-liquid coexisting state, and maintained for one hour, followed by cooling. This leads to solidification segregation of the multicomponent alloy layer 10, thereby forming concavity and convexity on a surface. For example, if he multicomponent alloy layer 10 is a Sn—Bi alloy, and when Sn is included in a range from 21% by weight to 57% by weight, solidification segregation occurs to Sn in a solid-liquid coexisting state.

Thereafter, as shown in FIG. 1C, the semiconductor wafer 1 is divided along the dicing line 1b into the plurality of semiconductor chips 1a. Then, the semiconductor chips 1a are mounted on a wiring substrate. The mounting method at this time is a chip on film (COF) or a tape carrier package (TCP), for example.

Figure 3A:
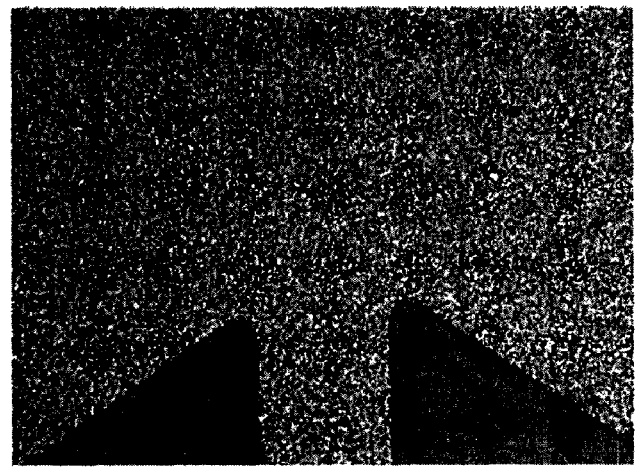
FIG. 3A is a scanning electron microscope (SEM) image of a surface of a multicomponent alloy layer 10 in a state shown in FIG. 1A.
Figure 3B:
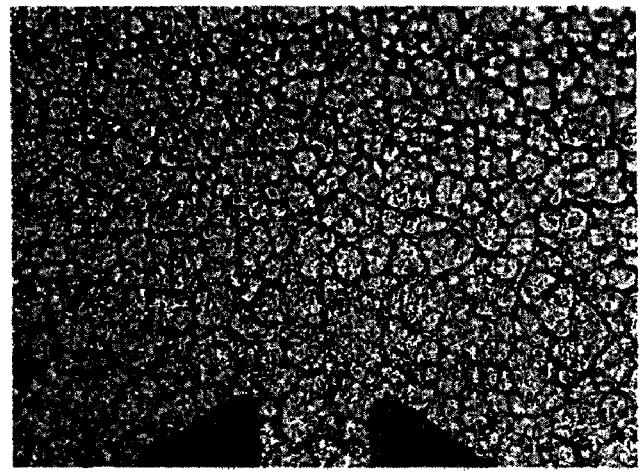
FIGS. 3B and 3C are SEM images of a surface of the multicomponent alloy layer 10 in a state shown in FIG. 1B.
Figure 3C:
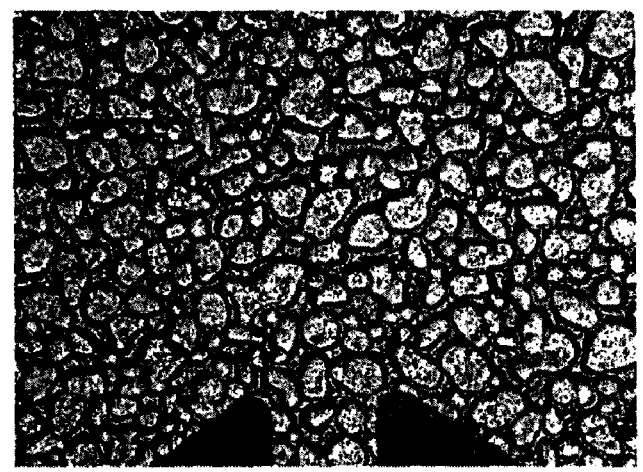

FIG. 3A is a scanning electron microscope (SEM) image of a surface of the multicomponent alloy layer 10 in a state shown in FIG. 1A. FIGS. 3B and 3C are SEM images of a surface of the multicomponent alloy layer 10 in a state shown in FIG. 1B. As the multicomponent alloy layer 10, Sn—Bi including Sn at a concentration of 84% by weight is used. FIG. 3B shows an example in which the multicomponent alloy layer 10 is cooled after heated at 160 degrees Celsius, while FIG. 3C shows an example in which the multicomponent alloy layer 10 is cooled after heated at 180 degrees Celsius. As it is obvious by comparing FIGS. 3A, 3B and 3C, the multicomponent alloy layer 10 is heated so as to be in the solid-liquid coexisting state, thereby forming concavity and convexity on the surface of the multicomponent alloy layer 10. Further, as it is obvious by comparing FIGS. 3B and 3C with each other, when the heating temperature is increased, the concavity and convexity become larger, thereby making a surface area of the multicomponent alloy layer 10 large.

According to the first embodiment as the above, the multicomponent alloy layer 10 having the concavity and convexity is formed on the rear face of the semiconductor chips 1a. Therefore, a same advantageous effect to be obtained by increasing a surface area of the rear face of the semiconductor chips 1a is obtained, resulting in improving heat dissipation efficiency from the rear face of the semiconductor chips 1a. Further, compared to a case of mounting a heat radiator on the rear face of the semiconductor chips la, a step to form a heat dissipation structure is simplified.

In the first embodiment, a step for heating the multicomponent alloy layer 10 up to being in the temperature range so as to be in the solid-liquid coexisting state, and cooling thereafter can be conducted after the semiconductor wafer 1 is divided into the semiconductor chips 1a.

Further, although the multicomponent alloy layer 10 is formed after the element isolation structure, the plurality of semiconductor elements, the wiring layer and the interlayer insulating film, the external connection terminal, and the passivation film are formed on the surface of the semiconductor wafer 1, it is possible that the multicomponent alloy layer 10 is formed on the rear face of the semiconductor wafer 1 after the element isolation structure is formed, and the plurality of semiconductor elements, the wiring layer and the interlayer insulating film, the external connection terminal, and the passivation film are formed thereafter. Alternatively, after the element isolation structure and the plurality of semiconductor elements are formed, the multicomponent alloy layer 10 is formed on the rear face of the semiconductor wafer 1, and the wiring layer and the interlayer insulating film, the external connection terminal, and the passivation film can be formed thereafter. In the cases above, the step for heating the multicomponent alloy layer 10 up to being in the temperature range so as to be in the solid-liquid coexisting state, and followed by cooling can be conducted at any timing after the multicomponent alloy layer 10 is formed. However, there is one condition where heat treatment for heating the multicomponent alloy layer 10 up to being in a temperature range to be a liquid phase should not be conducted after the step.

Figure 4A:
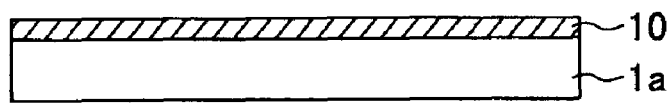
FIGS. 4A and 4B show sectional views for explaining a method for manufacturing a semiconductor device according to a second embodiment.
Figure 4B:
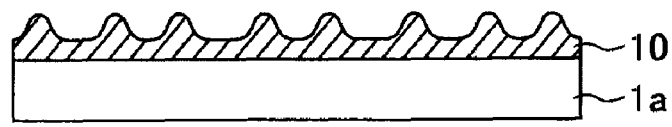

Each figure of FIGS. 4A and 4B is a sectional view for explaining a method for manufacturing a semiconductor device according to a second embodiment of the invention. As for a structure similar to that of the first embodiment, the same numerals are given and the description shall be omitted.

First, a semiconductor wafer (e.g. silicon wafer) is prepared and divided into individual pieces as the semiconductor chips 1a. On a front face of the semiconductor wafer, an element isolation structure, a plurality of semiconductor elements (e.g. transistors), a wiring layer and an interlayer insulating film, an external connection terminal, and a passivation film are formed. As shown in FIG. 4A, the multicomponent alloy layer 10 is formed on a rear face of the semiconductor chips 1a.

Subsequently, as shown in FIG. 4B, the multicomponent alloy layer 10 is heated up to being in a temperature range to be a solid-liquid coexisting state, and maintained for one hour, followed by cooling. This leads to solidification segregation of the multicomponent alloy layer 10, thereby forming concavity and convexity on a surface.

As described above, the second embodiment can also provide the same advantageous effect as that of the first embodiment. In addition, in the second embodiment, after the semiconductor chips 1a are mounted on a tape-like flexible substrate, the steps explained by referring to FIGS. 4A and 4B can be performed before dividing the flexible substrate. This can lead to high productivity.

Figure 5A:
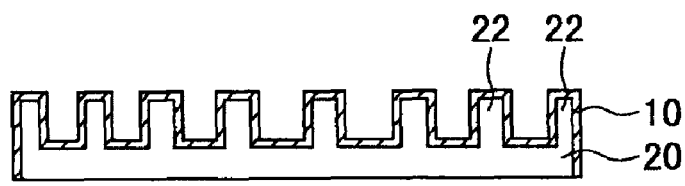
FIGS. 5A to 5C are sectional views for explaining a method for manufacturing a semiconductor device according to a third embodiment.
Figure 5B:
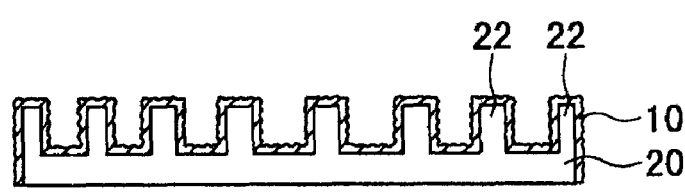
Figure 5C:
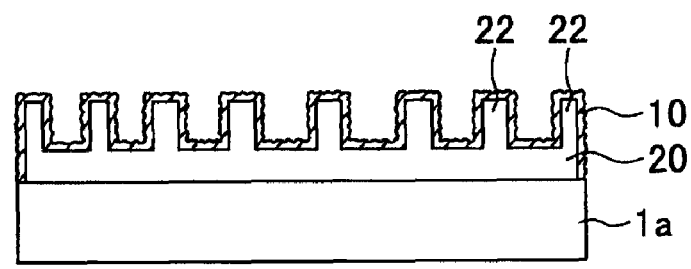

Each figure in FIGS. 5A to 5C is a sectional view for explaining a method for manufacturing a semiconductor device according to a third embodiment of the invention. As for a structure similar to that of the first embodiment, the same numerals are given and the description shall be omitted.

First, a heat radiator 20 as shown in FIG. 5A is prepared. A plurality of heat radiating fins 22 are formed on a front face of the heat radiator 20. Then, the multicomponent alloy layer 10 is formed on the front face of the heat radiator 20. Here, the multicomponent alloy layer 10 is also formed on each surface of the plurality of heat radiating fins 22.

Subsequently, as shown in FIG. 5B, the multicomponent alloy layer 10 is heated up to being in a temperature range to be a solid-liquid coexisting state, and maintained for one hour, followed by cooling. This leads to solidification segregation of the multicomponent alloy layer 10, thereby forming concavity and convexity on a surface.

Next, the semiconductor chip 1a as shown in FIG. 5C is prepared. In the third embodiment, the multicomponent alloy layer 10 is not formed on a rear face of the semiconductor chips 1a. Then, a rear face of the heat radiator 20 is fixed to the rear face of the semiconductor chips 1a. For this fixing, an adhesive agent having high thermal conductivity is employed, for example. However, fixing with a screw is also applicable.

According to the third embodiment as the above, the multicomponent alloy layer 10 having the concavity and convexity is formed on a surface of the heat radiating fins 22 included in the heat radiator 20. Therefore, a same advantageous effect to be obtained by increasing a surface area of the heat radiating fins 22 is obtained, resulting in increasing heat dissipation efficiency from the heat radiating fins 22 to the air. Therefore, the heat radiator 20 can be reduced in size.

In addition, it should be understood that the above-mentioned embodiments and examples are not intended to limit the invention. Various changes and modifications can be made without departing from the spirit and scope of the invention.

What is claimed is:

1. A method for manufacturing a semiconductor device, comprising:
    forming a multicomponent alloy layer on a rear face of a semiconductor wafer having a plurality of semiconductor elements formed on a front face, the multicomponent alloy layer being in a solid-liquid coexisting state in a specific temperature range;
    after forming the multicomponent alloy layer, heating the multicomponent alloy layer to be in the specific temperature range so as to be in the solid-liquid coexisting state, and after heating the multicomponent alloy layer, cooling the multicomponent alloy layer; and
    after heating and cooling the multicomponent alloy layer, dividing the semiconductor wafer and the multicomponent alloy layer into a plurality of semiconductor chips.

* * * * *